(12) United States Patent
Ariyoshi

(10) Patent No.: US 7,466,137 B2
(45) Date of Patent: Dec. 16, 2008

(54) APPARATUS AND METHOD FOR MEASURING VOLTAGE OF THE FUEL CELL STACK USING A CAPACITOR

(75) Inventor: Toshiaki Ariyoshi, Saitama (JP)

(73) Assignee: Honda Motor Co., Ltd., Tokyo (JP)

( * ) Notice: Subject to any disclaimer, the term of this patent is extended or adjusted under 35 U.S.C. 154(b) by 140 days.

(21) Appl. No.: 11/291,395

(22) Filed: Nov. 30, 2005

(65) Prior Publication Data

US 2006/0113986 A1     Jun. 1, 2006

(30) Foreign Application Priority Data

Nov. 30, 2004   (JP)   ............... 2004-345574

(51) Int. Cl.
*G01N 27/416*   (2006.01)
(52) U.S. Cl. .................. 324/426; 324/433
(58) Field of Classification Search .......... 324/76.11
See application file for complete search history.

(56) References Cited

U.S. PATENT DOCUMENTS

| | | | | |
|---|---|---|---|---|
| 3,230,452 | A * | 1/1966 | Angello | 324/771 |
| 5,250,903 | A * | 10/1993 | Limuti et al. | 324/427 |
| 6,362,626 | B2 * | 3/2002 | Furukawa | 324/429 |
| 6,392,413 | B2 * | 5/2002 | Onishi et al. | 324/429 |
| 6,407,534 | B1 * | 6/2002 | Mukainakano | 320/162 |
| 6,424,156 | B1 * | 7/2002 | Okamura | 324/426 |
| 6,674,264 | B2 * | 1/2004 | Sato et al. | 320/101 |
| 6,909,285 | B2 * | 6/2005 | Jordan et al. | 324/382 |
| 2003/0190510 | A1 * | 10/2003 | Musselman et al. | 429/23 |

FOREIGN PATENT DOCUMENTS

| | | |
|---|---|---|
| JP | 11-248757 | 9/1999 |
| JP | 11-339828 | 12/1999 |
| JP | 2000-55966 | 2/2000 |
| JP | 2002-325371 | 11/2002 |
| JP | 2003-297407 | 10/2003 |

OTHER PUBLICATIONS

Japanese Office Action for Application No. 2004-345574, dated May 8, 2008.
Japanese Office Action for Application No. 2004-345574, dated Jul. 29, 2008.

* cited by examiner

*Primary Examiner*—Paresh Patel
(74) *Attorney, Agent, or Firm*—Lahive & Cockfield, LLP; Anthony A. Laurentano, Esq.

(57) ABSTRACT

An apparatus for measuring voltage is provided which measures output voltage between at least one pair of detecting terminals provided on an object under measurement. The apparatus for measuring voltage includes a first connecting terminal connected to one of the at least one pair of detecting terminals, a second connecting terminal connected to the other of the at least one pair of detecting terminals, a capacitor connected between the first connecting terminal and the second connecting terminal, a voltage detecting means for measuring voltage of the capacitor, and a pre-charging means for pre-charging the capacitor with predetermined voltage out of range of voltage which the object under measurement can output to the at least one pair of detecting terminals.

24 Claims, 8 Drawing Sheets

US 7,466,137 B2

APPARATUS AND METHOD FOR MEASURING VOLTAGE OF THE FUEL CELL STACK USING A CAPACITOR

CROSS REFERENCE TO RELATED APPLICATIONS

This application claims the foreign priority benefit under Title 35, United States Code, §119(a)-(d) of Japanese Patent Application No. 2004-345574, filed on Nov. 30, 2004 in the Japan Patent Office, the disclosure of which is herein incorporated by reference in its entirety.

BACKGROUND OF THE INVENTION

1. Field of the Invention

The present invention relates to an apparatus and a method for measuring voltage such as to monitor voltage of a power source.

2. Description of the Related Art

A fuel cell stack mounted in a fuel cell vehicle is a stack of a great number of cells formed by, for example, a solid polyelectrolyte membrane placed between an anode electrode and a cathode electrode which are further sandwiched between a pair of separators. This kind of fuel cell stack has a voltage monitor for monitoring voltage of each cell to detect malfunction of the cell as soon as possible. For example, in a fuel cell stack disclosed in JP 11-339828A (Paragraph 0009), a detecting terminal is provided on each of separators of each cell, and plural connecting terminals are provided on a connector and connected to these detecting terminals, so that the voltage can be monitored.

Meanwhile, in a fuel cell stack, a great number of cells are connected in series to obtain high voltage since cell voltage of each cell is as low as about 1 V (volt). Accordingly, when malfunction causing electromotive force to be reduced occurs in one of the cells, the malfunction of the cell may spread to the other normal cells and causes total power supply obtained from the fuel cell stack to be low. Therefore, it is required to measure cell voltage of each cell correctly.

However, in a fuel cell stack, 0 volt may be output as cell voltage when power is not generated even though no malfunction occurs. Therefore, there is a problem that it is impossible to determine whether the detected output voltage is actual cell voltage or caused by faulty electrical continuity between detecting terminals and connecting terminals of a connector.

SUMMARY OF THE INVENTION

An object of the present invention is to provide an apparatus and a method for measuring voltage to improve reliability of monitoring voltage by exactly determining whether output voltage is output from an object under measurement or caused by faulty electrical continuity to solve the above conventional problem.

An apparatus for measuring voltage according to the present invention measures output voltage between at least one pair of detecting terminals provided on an object under measurement. The apparatus for measuring voltage includes a first connecting terminal connected to one of the at least one pair of detecting terminals, a second connecting terminal connected to the other of the at least one pair of detecting terminals, a capacitor connected between the first connecting terminal and the second connecting terminal, a voltage detecting means for measuring voltage of the capacitor, and a pre-charging means for pre-charging the capacitor with pre-determined voltage out of range of voltage which the object under measurement can output to the at least one pair of detecting terminals.

An apparatus for measuring voltage according to the present invention makes it possible to determine that the detecting terminals are not normally electrically connected to the connecting terminals when voltage of the capacitor detected by the voltage detecting means is equal to voltage pre-charged by the pre-charging means and that the detecting terminals are normally electrically connected to the connecting terminals when detected voltage is different from the voltage pre-charged by the pre-charging means. Moreover, it is also possible to determine that the detected voltage is output voltage from the object under measurement when the detecting terminals are normally electrically connected to the connecting terminals.

It is preferred that the predetermined voltage is negative with respect to the output voltage from the object under measurement. Charging the capacitor with voltage negative with respect to the output voltage from the object under measurement makes it possible to prevent the object under measurement from deteriorating since current does not flow in a direction to charge the object under measurement when the detecting terminals are normally electrically connected to the connecting terminals.

For example, the object under measurement is a fuel cell stack consisting of a stack of plurality of power generating cells. The present invention is especially effective for monitoring output voltage from an object such as a fuel cell stack which has a great number of terminals and may output 0 volt.

Moreover, a method for measuring voltage according to the present invention is a method for measuring voltage which measures output voltage between at least one pair of detecting terminals provided on an object under measurement. The method for measuring voltage includes steps of pre-charging a capacitor with predetermined voltage out of range of voltage which the object under measurement can output to the at least one pair of detecting terminals, and connecting the capacitor to the at least one pair of detecting terminals to measure voltage of the capacitor and obtain the output voltage between the at least one pair of detecting terminals.

A method for measuring voltage according to the present invention makes it possible to determine that the detecting terminals are not normally electrically connected to the connecting terminals when detected voltage is equal to pre-charged voltage and that the detecting terminals are normally electrically connected to the connecting terminals when detected voltage is different from the pre-charged voltage. Moreover, it is also possible to determine that the detected voltage is output voltage from the object under measurement when the detecting terminals are normally electrically connected to the connecting terminals.

DESCRIPTION OF THE PREFERRED EMBODIMENTS

First Embodiment

Figure 5:
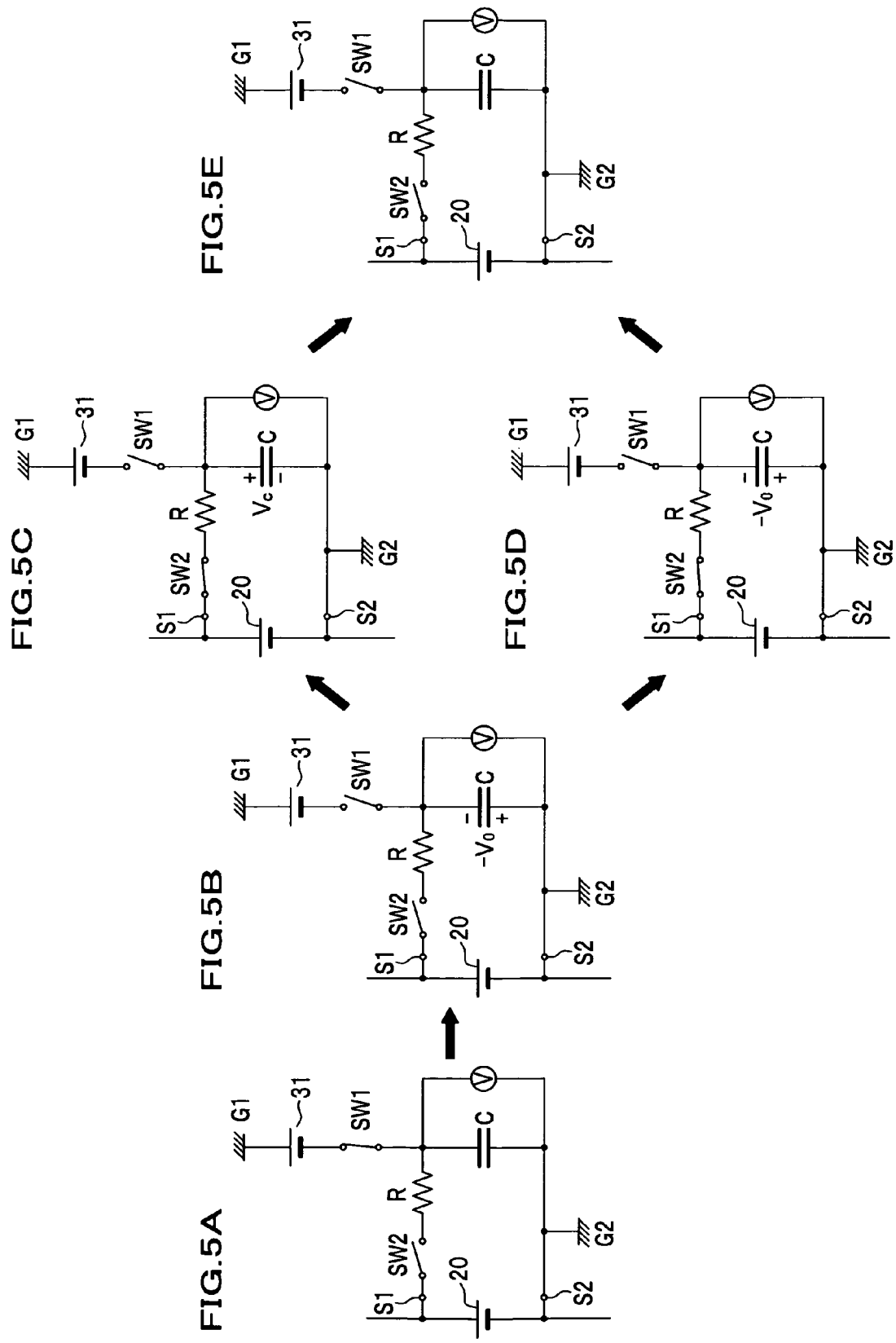
FIGS. 5A-5E are circuit diagrams showing states in each period A-D in FIG. 4.

A case where an apparatus for measuring voltage 1 according to the present embodiment is mounted in a fuel cell stack FC (an object under measurement) will be described below. Meanwhile, each of FIG. 3 and FIG. 5 illustrates a circuit diagram for detecting output voltage from a cell (power generating cell) 20.

Figure 1:
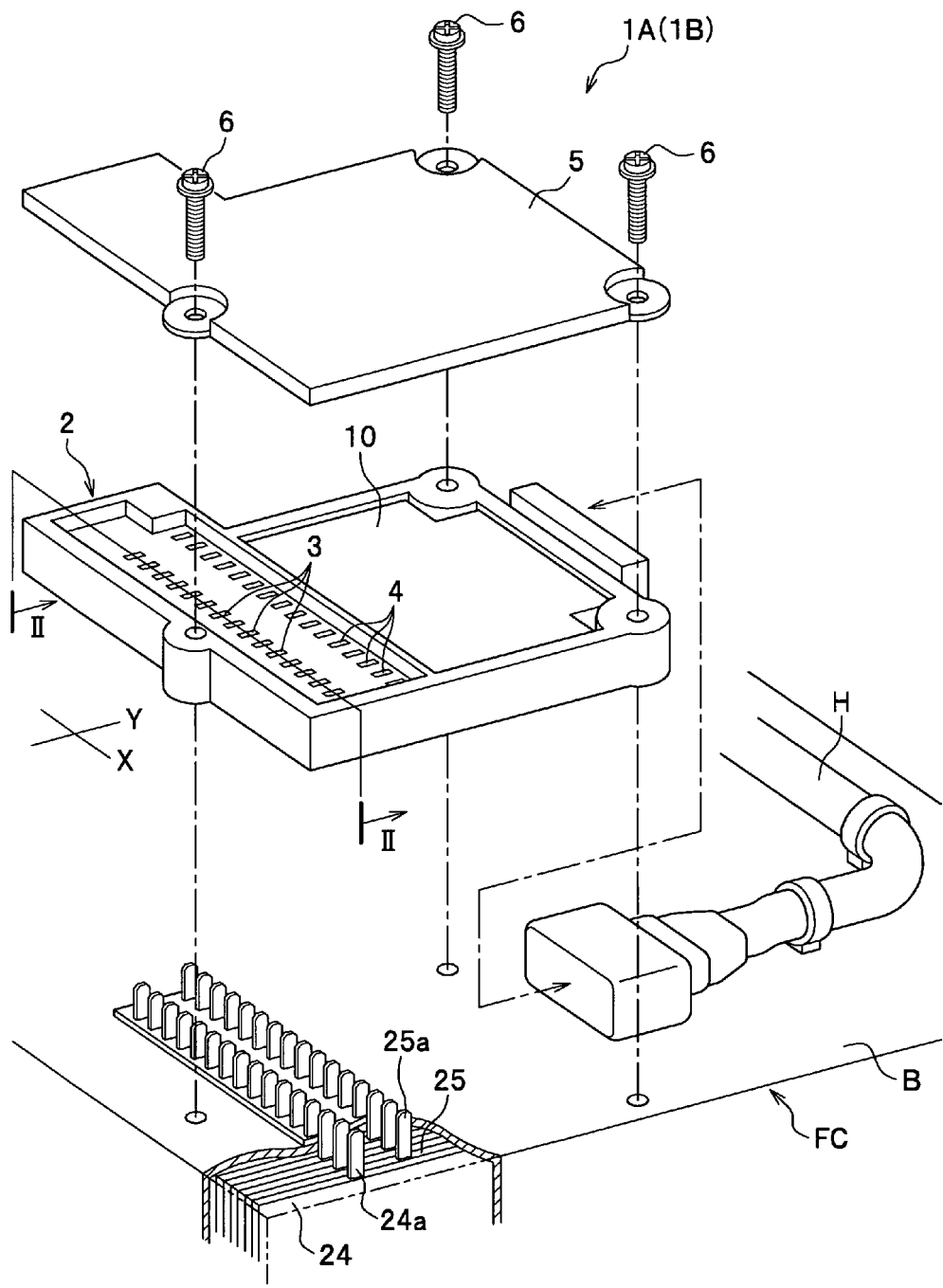
FIG. 1 is an exploded perspective view showing state of a fuel cell stack before an apparatus for measuring voltage according to the present embodiment is mounted.

As shown in FIG. 1, an apparatus for measuring voltage 1A includes a connector 2 having plurality of connecting terminals 3 and 4. The connecting terminals 3 and 4 are arranged in a staggered configuration in Y direction and in two rows in X direction. In addition, a circuit substrate 10 is integrated and incorporated into the connector 2. A covering member 5 is provided on the upper side of the connector 2 to cover entire of the connecting terminals 3 and 4 and the substrate 10. The connector 2 is fixed on a box B which contains the fuel cell stack FC, together with the covering member 5 through screws 6, 6, and 6. Moreover, a harness H is connected to the connector 2, and the connecting terminals 3 and 4 and the circuit substrate 10 are connected to a controller (controlling means) 50 described later through the harness H.

Figure 2:
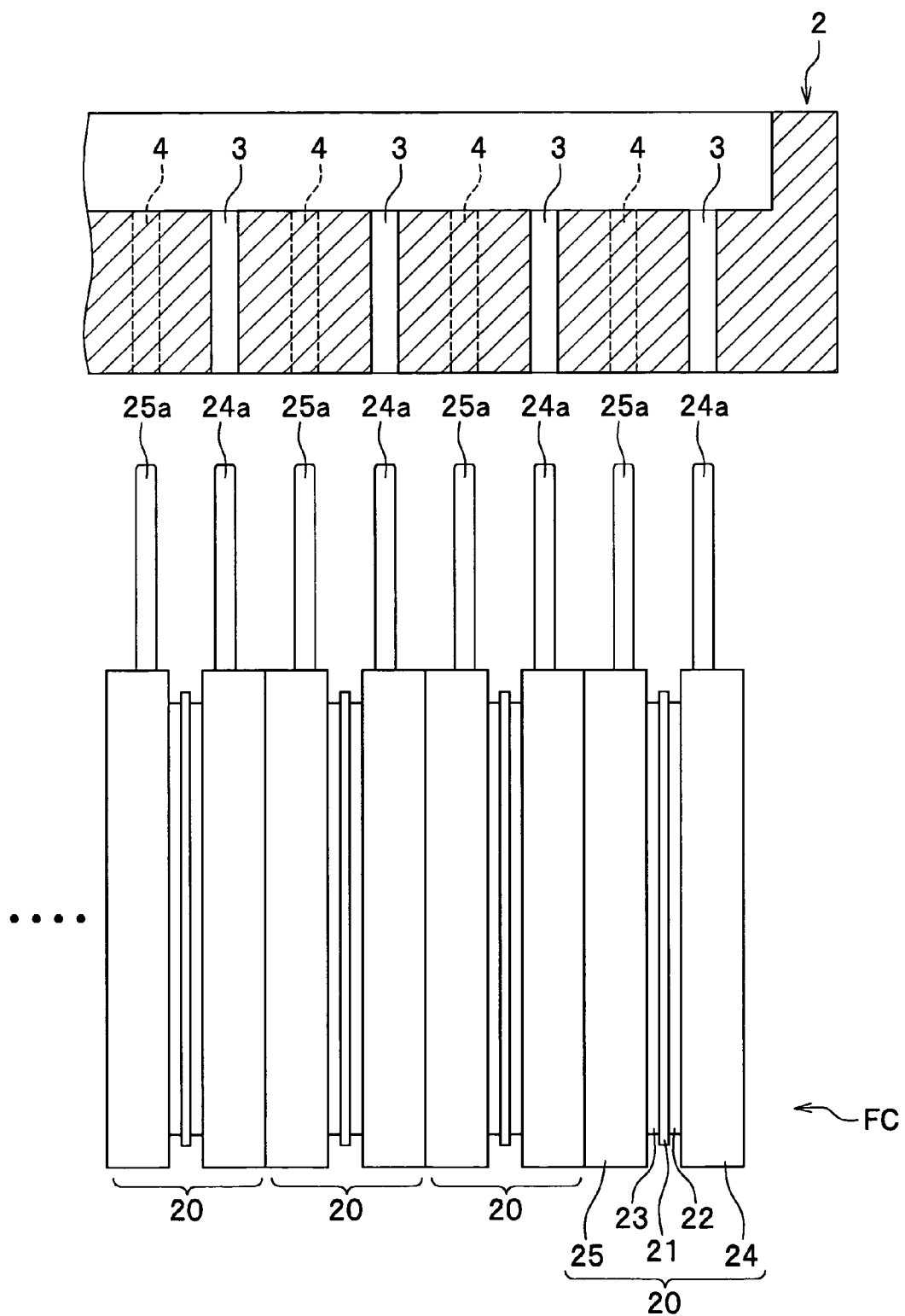
FIG. 2 is a sectional view on line II-II of FIG. 1.

As shown in FIG. 2, the fuel cell stack FC is a stack of a great number of cells each of which (a single cell 20) is formed by a pair of conductive separators 24 and 25 which sandwich an cathode electrode 22 provided on one of sides of a solid polyelectrolyte membrane 21 and an anode electrode 23 provided on the other side. In the fuel cell stack FC, cell voltage (electromotive force) of each cell 20 is about 1 V (volt) and a great number of the cells 20 are connected in series to obtain high voltage (high power). Detecting terminals 24a and 25a are provided respectively on the top ends of the separators 24 and 25, and top ends of the detecting terminals 24a and 25a protrude upward from the box B. The connector 2 is fixed on a predetermined area on the box B so that each of the detecting terminals 24a is connected to a corresponding connecting terminal (first connecting terminal) 3 and each of the detecting terminals 25a is connected to a corresponding connecting terminal (second connecting terminal) 4.

Figure 3:
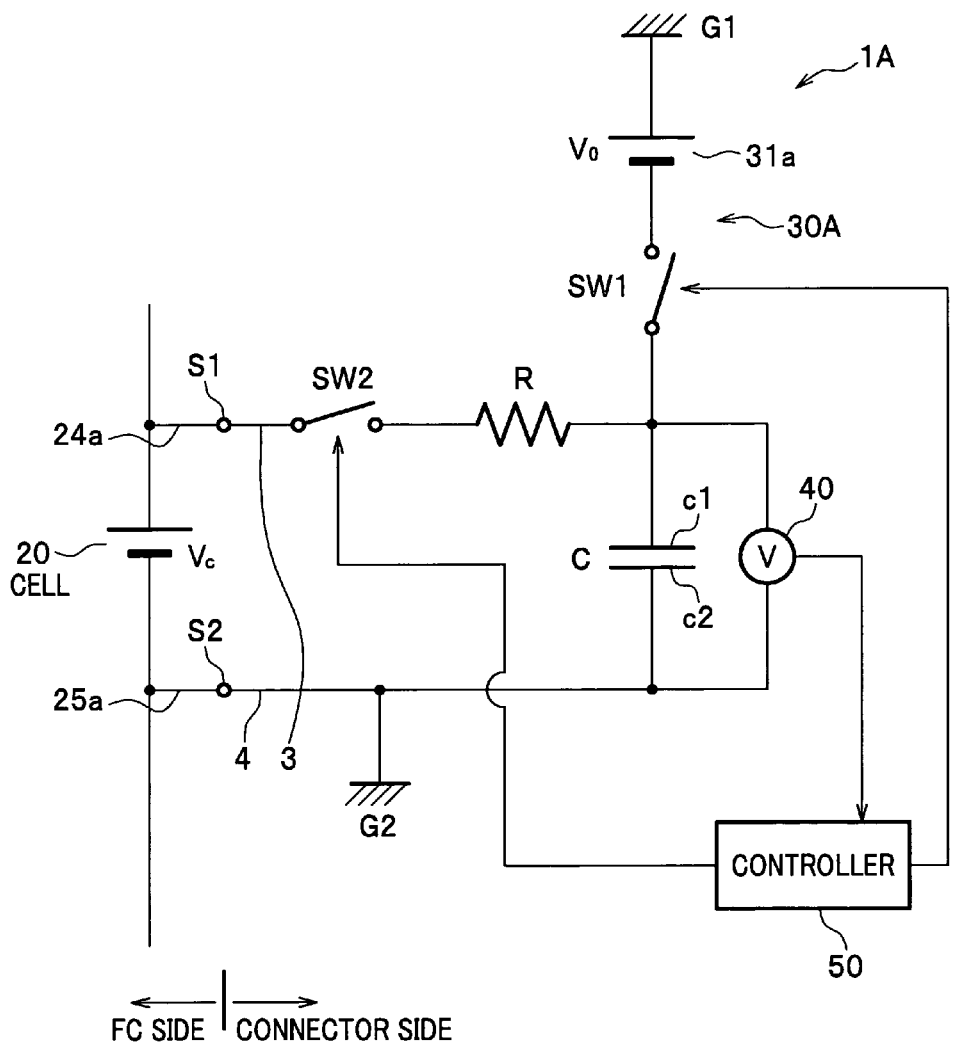
FIG. 3 is a circuit diagram showing an apparatus for measuring voltage according to a first embodiment.

As shown in FIG. 3, the apparatus for measuring voltage 1A according to the first embodiment includes a capacitor C arranged between a connecting terminal 3 and a connecting terminal 4, a pre-charging means 30A, a voltmeter (voltage detecting means) 40 for measuring voltage between both ends of the capacitor C, and a controller 50.

The pre-charging means 30A includes a charging power source 31a and a first switch (first switching means) SW1. A positive electrode at one of ends of the charging power source 31a is connected to ground G1, and a negative electrode at the other end of the charging power source 31a is connected to the capacitor C through the first switch SW1. The first switch SW1 is a switch for connecting or disconnecting the charging power source 31a to or from the capacitor C.

Additionally, a second switch (second switching means) SW2 and a resistor R having predetermined resistance are connected in series between the connecting terminal 3 and the capacitor C. In the present embodiment, the second switch SW2 is connected to the connecting terminal 3 and the resistor R is connected to the capacitor C. Moreover, ground G2 is connected between the connecting terminal 4 and the capacitor C. The second switch SW2 is a switch for connecting or disconnecting the connecting terminal 3 to or from the resistor R. Therefore, simply connecting respectively the detecting terminals 24a and 25a provided on the fuel cell stack FC to the connecting terminals 3 and 4 provided on the apparatus for measuring voltage 1A does not bring electrical connection unless the second switch SW2 is turned ON.

The controller 50 can control on/off operation of each of the first switch SW1 and the second switch SW2 based on predetermined control signals and obtain values of voltage measured by the voltmeter 40.

In the apparatus for measuring voltage 1A, for example, the capacitor C, the resistor R, the second switch SW2, and the voltmeter 40 are incorporated into the circuit substrate 10 in the connector 2, and the controller 50 and the pre-charging means 30A are connected to the connector 2 through the harness H and provided away from the connector 2. A smoothing capacitor, which is conventionally provided as a filter to remove noises and stabilize voltage where cell voltage of the fuel cell stack FC is input, such as in the circuit substrate 10, may be employed as the capacitor C in the present embodiment. Accordingly, the circuit can be constructed at low cost since it is not necessary to provide another dedicated capacitor.

Next, operation in the apparatus for measuring voltage 1A in the first embodiment is described referring to FIGS. 3 through 5E. Note that cell voltage of the cell 20 of the fuel cell stack FC is referred as Vc, and power source voltage obtained from the charging power source 31a is referred as V0 (See FIG. 3), hereafter. Moreover, the voltage V0 is set to voltage out of range of cell voltage Vc which the cell 20 can output to the detecting terminals 24a and 25a. For example, when the cell voltage Vc changes within a range from 0V to 1.3V, the power source voltage V0 is set to voltage out of the range. S1 and S2 respectively show connecting points between the detecting terminal 24a and the connecting terminal 3 and between the detecting terminal 25a and the connecting terminal 4 in FIGS. 3 through 5E.

First, as shown in FIG. 3, with the first switch SW1 and the second switch SW2 being turned OFF, the detecting terminals 24a and 25a provided on the fuel cell stack FC are respectively connected to the connecting terminals 3 and 4 provided on the connector 2. Then, as shown in a period A in FIG. 4, and FIG. 5A, the first switch SW1 is switched to ON by a control signal from the controller 50. Accordingly, as shown in FIG. 5A, the capacitor C starts being charged so that one of electrode plates c1 (See FIG. 3) of the capacitor C on a side of the charging power source 31a is negatively charged and the other electrode plate c2 (See FIG. 3) is positively charged, and then the capacitor C stops being charged when voltage of the capacitor C becomes −V0. Here, a minus sign for the voltage −V0 indicates that the voltage −V0 is negative with respect to the cell voltage Vc of the cell 20.

Figure 4:
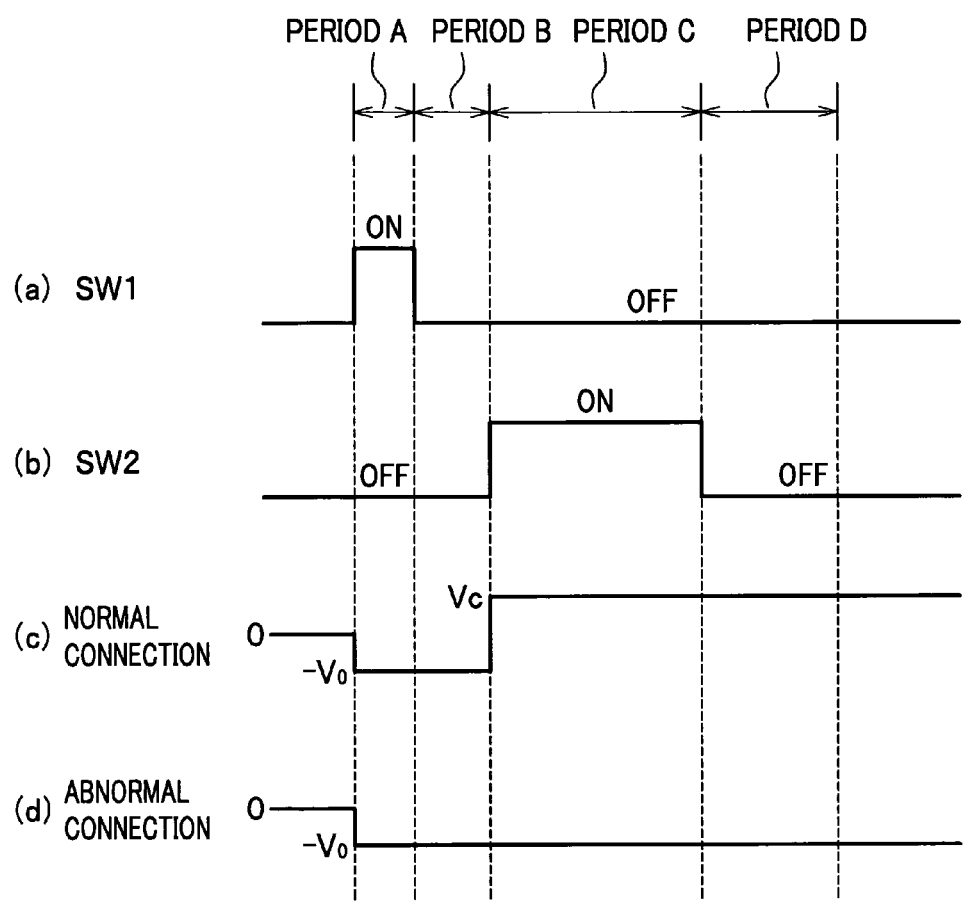
FIG. 4 is a timing chart diagram showing change of output voltage in relation to switching operation of each switch in the first embodiment.

Thus, as shown in a period B in FIGS. 4, and 5B, the capacitor C remains charged with voltage −V0 when the first switch SW1 is switched to OFF.

After that, as shown in a period C in FIGS. 4, and 5C, the second switch SW2 is switched to ON. At this time, as shown in (c) in FIG. 4, the voltage −V0 of the capacitor C changes to the cell voltage Vc of the fuel cell stack FC if the detecting terminals 24a and 25a are normally electrically connected to the connecting terminals 3 and 4 at the connecting points S1 and S2 respectively. Here, as shown in FIG. 5C, with the electrode plates c1 and c2 (See FIG. 3) of the capacitor C being respectively charged positively and negatively, the capacitor C is charged with the voltage Vc. The controller 50 (See FIG. 3) determines that the detecting terminals 24a and 25a are normally electrically connected to the connecting terminals 3 and 4 at the connecting points S1 and S2 respectively when the voltage of the capacitor C changes from the pre-charged voltage −V0 to the cell voltage Vc. Additionally, in this case, the detected voltage is determined to be the cell voltage Vc. Then, as shown in a period D in FIG. 4, and FIG. 5E, the second switch SW2 is switched to OFF and process ends.

Moreover, as shown in the period C in FIGS. 4, and 5D, when the second switch SW2 is switched to ON, the voltage of the capacitor C remains −V0 as shown in (d) in FIG. 4 if the detecting terminals 24a and 25a are not normally electrically connected to the connector 2 at the connecting points S1 and S2 respectively. The controller 50 determines that the detecting terminals 24a and 25a are not normally electrically connected to the connecting terminals 3 and 4 at the connecting points S1 and S2 respectively when the voltage of the capacitor C remains the pre-charged voltage −V0.

Accordingly, in the apparatus for measuring voltage 1A in the first embodiment, it is possible to easily determine whether the detecting terminals 24a and 25a are normally electrically connected to the connecting terminals 3 and 4 of the connector 2 respectively by monitoring the voltage of the capacitor C. Moreover, though the cell voltage becomes 0 volt when no external load such as a drive motor requires generating power and therefore no power is generated in a fuel cell stack FC, it is also possible to easily determine whether the output voltage is the cell voltage Vc of the fuel cell stack FC or caused by abnormal electrical connection at the connecting points S1 or S2 even when 0 volt is output.

Furthermore, as described above, it is possible to reduce load of the fuel cell stack FC and prevent the fuel cell stack FC from deteriorating since the capacitor C is charged with voltage negative with respect to the cell voltage Vc so that the fuel cell stack FC operates in a direction to charge the capacitor C.

Second Embodiment

Figure 6:
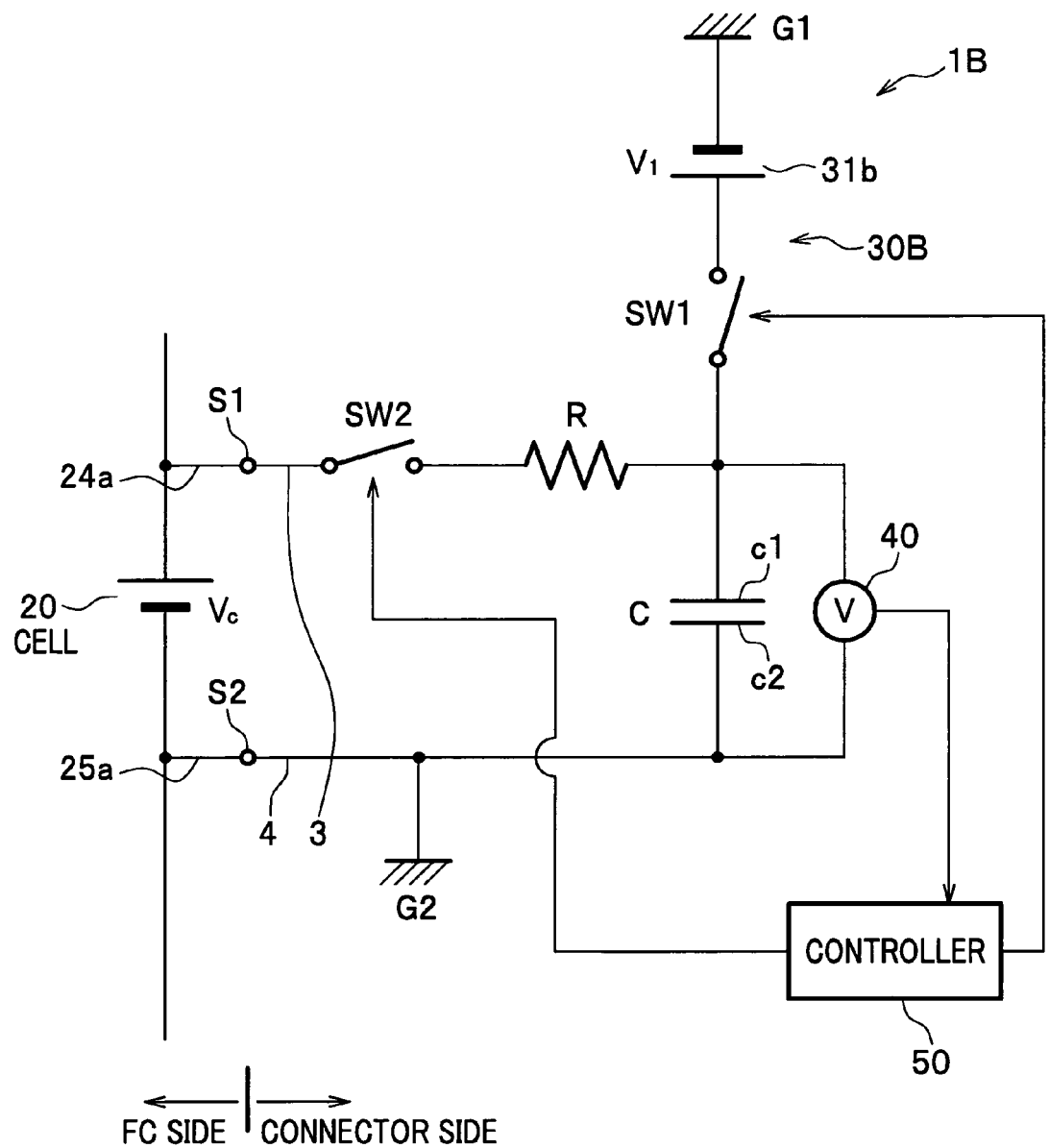
FIG. 6 is a circuit diagram showing an apparatus for measuring voltage according to a second embodiment.
Figure 7:
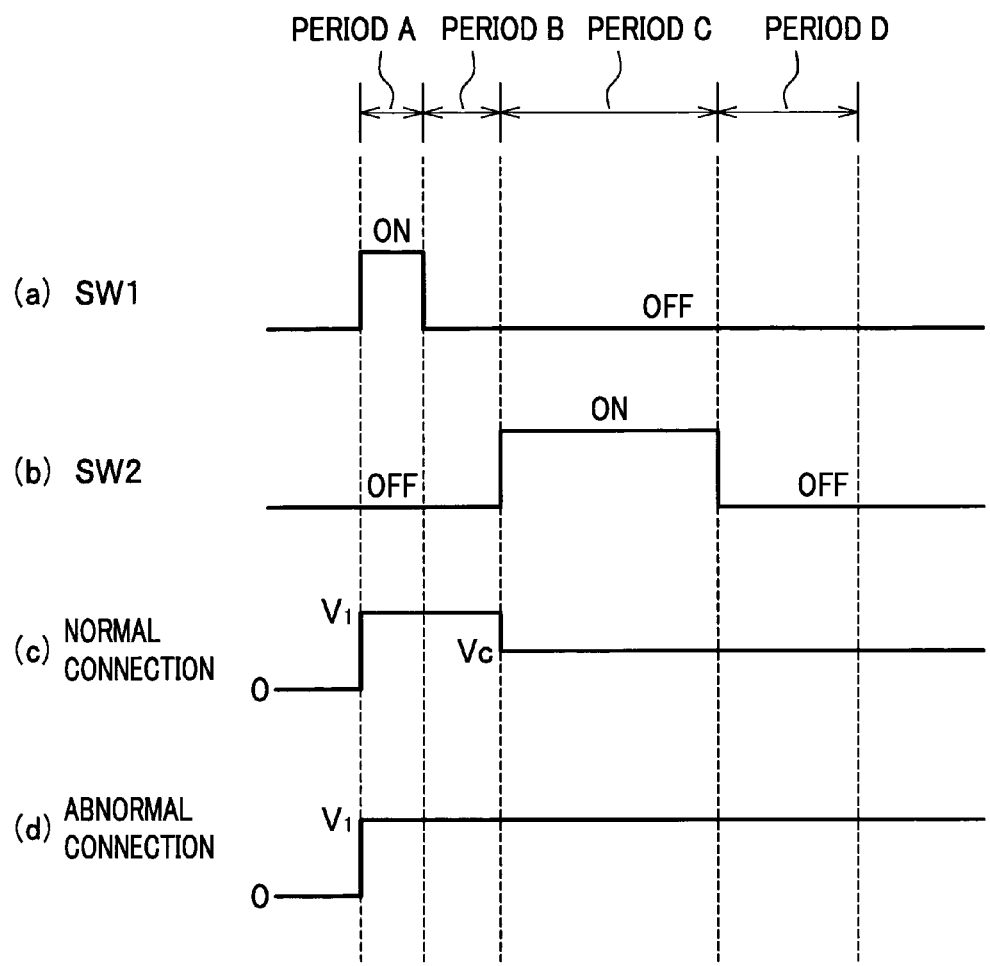
FIG. 7 is a timing chart diagram showing change of output voltage in relation to switching operation of each switch in the second embodiment.

FIG. 6 is a circuit diagram showing an apparatus for measuring voltage according to a second embodiment, and FIG. 7 is a timing chart showing change of output voltage in relation to switching operation of each switch. In the apparatus for measuring voltage 1B according to the second embodiment, a charging power source 31b, which has power source voltage V1, is replaced with the charging power source 31a in the apparatus for measuring voltage 1A and arranged with reversed poles. Here, the voltage V1 is set to a value different from a possible value of the cell voltage Vc. For example, when the cell voltage Vc is from 0V to 1.3V as described above, the voltage V1 may be set to 1.5V or 2.0V which is higher than 1.3V. Setting the voltage V1 to a value close to the upper limit of the cell voltage Vc makes it possible to reduce useless power consumption in charging a capacitor.

In the second embodiment, while a first switch SW1 and a second switch SW2 are turned OFF, detecting terminals 24a and 25a provided on a fuel cell FC are respectively connected to connecting terminals 3 and 4. Then, as shown in a period A in FIG. 7, the first switch SW1 is switched to ON and a capacitor C is charged with voltage V1, and then, as shown in a period B in FIG. 7, the first switch SW1 is switched to OFF. Subsequently, as shown in a period C in FIG. 7, when the second switch SW2 is switched to ON, voltage V1 of the capacitor C changes to the cell voltage Vc of the fuel cell FC if the detecting terminals 24a and 25a are normally electrically connected to the connecting terminals 3 and 4 at the connecting points S1 and S2 respectively as shown in FIG. 7 (c). Moreover, the voltage of the capacitor C remains V1 if the detecting terminals 24a and 25a are not normally electrically connected to the connecting terminals 3 and 4 at the connecting points S1 and S2 respectively as shown in FIG. 7 (d).

In the second embodiment, it is also possible to easily determine whether the detecting terminals 24a and 25a are normally electrically connected to the connecting terminals 3 and 4 at the connecting points S1 and S2 respectively by measuring the voltage of the capacitor C. In addition, no special voltage process is required when the capacitor C is charged with positive voltage with respect to the cell voltage Vc as in the second embodiment.

Third Embodiment

Figure 8:
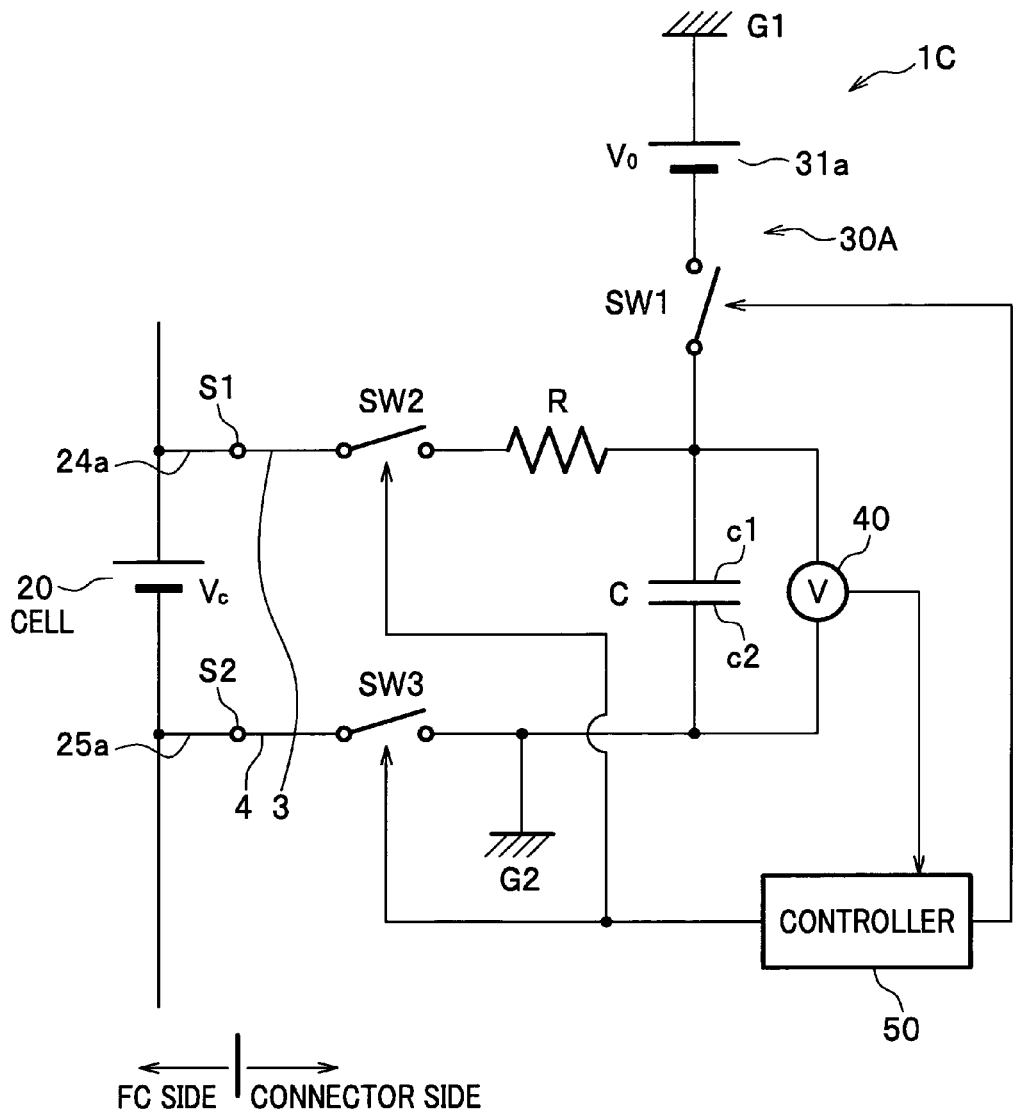
FIG. 8 is a circuit diagram showing an apparatus for measuring voltage according to a third embodiment.

FIG. 8 is a circuit diagram showing an apparatus for measuring voltage according to a third embodiment. In the apparatus for measuring voltage 1C according to the third embodiment, a third switch (third switching means) SW3 which the controller 50 can turn on/off is added to the apparatus for measuring voltage 1A according to the first embodiment. Thus the apparatus for measuring voltage 1C can be an insulated type with the third switch SW3. Moreover, the apparatus for measuring voltage 1B according to the second embodiment may be provided with a third switch so as to be an insulated type, similarly to FIG. 8.

The present invention should not be limited to the embodiments described above. For example, the second switch SW2 does not need to be included. In this case, the detecting terminals 24a and 25a may be respectively connected to the connecting terminals 3 and 4 after the pre-charging means 30A or 30B has pre-charged the capacitor C respectively with the voltage −V0 or V1 which is different from the output cell voltage Vc. In this case, similarly to the cases described above, the voltage of the capacitor C changes to the cell voltage Vc if the connecting points S1 and S2 are normal, and the voltage of the capacitor C remains −V0 or V1 without changing if the connecting points S1 and S2 are not normal.

In the embodiments described above, only state of the points S1 and S2 has been discussed, however, it is possible to certainly detect whether there is faulty electrical continuity in the circuit by monitoring the voltage of the capacitor C even when any points in the circuit other than the connecting points S1 and S2 are electrically disconnected.

By the way, the apparatus for measuring voltage 1A and 1B may operate, for example, when the fuel cell stack FC is started up, or periodically or continuously. Though examples of measuring voltage of a fuel cell stack FC have been described in the above embodiments, the present invention may be also applied for monitoring voltage of a battery provided in a hybrid vehicle.

According to the present invention, it is possible to determine whether output voltage is output from an object under measurement or caused by faulty electrical continuity so as to improve reliability of monitoring voltage. Moreover, it is also possible to determine whether detecting terminals are correctly connected to connecting terminals in assembling.

While the described embodiments represent the preferred forms of the present invention, it is to be distinctly understood that the invention is not limited thereto but may be otherwise variously embodied within the spirit and scope of the following claims.

What is claimed is:

1. An apparatus for measuring voltage which measures an output voltage between at least one pair of detecting terminals provided on fuel cell stack comprising one or more power generating cells that are stacked together, comprising:
   a first connecting terminal connected to one of the detecting terminals in the at least one pair of detecting terminals;
   a second connecting terminal connected to the other detecting terminal of the at least one pair of detecting terminals;
   a capacitor connected between the first connecting terminal and the second connecting terminal;
   a voltage detecting means for measuring a voltage of the capacitor;
   a pre-charging means for pre-charging the capacitor with a predetermined voltage, wherein the predetermined voltage is different than a voltage which the fuel cell stack outputs to the at least one pair of detecting terminals, the predetermined voltage is negative with respect to the output voltage from the fuel cell stack; and
   a controlling means for comparing the voltage of the capacitor with the voltage which the fuel cell stack outputs.

2. An apparatus for measuring voltage according to claim 1, wherein the pre-charging means comprises:
   a power source for charging the capacitor with the predetermined voltage; and
   a first switching means for connecting/disconnecting the capacitor to/from the power source.

3. An apparatus for measuring voltage according to claim 2, further comprising a second switching means for connecting/disconnecting the capacitor to/from the first connecting terminal.

4. An apparatus for measuring voltage according to claim 3, wherein the controlling means controls:
   the first switching means such that the capacitor is connected to the power source so as to be charged before the output voltage between the at least one pair of detecting terminals is measured; and
   the second switching means such that the capacitor is connected to the first connecting terminal and the second connecting terminal after the capacitor has been charged.

5. An apparatus for measuring voltage according to claim 4, wherein the controlling means controls:
   the second switching means such that the capacitor is disconnected from the first connecting terminal before the capacitor is connected to the power source; and
   the first switching means such that the capacitor is disconnected from the power source before the capacitor is connected to the first connecting terminal and the second connecting terminal.

6. An apparatus for measuring voltage according to claim 5, further comprising a third switching means for connecting/disconnecting the capacitor to/from the second connecting terminal, wherein the controlling means controls the third switching means.

7. An apparatus for measuring voltage according to claim 1, wherein the capacitor is a smoothing capacitor.

8. An apparatus for measuring voltage according to claim 1, wherein the controlling means determines that the first and the second connecting terminals are normally electrically connected to the at least one pair of detecting terminals if the voltage of the capacitor changes from the predetermined voltage to the voltage which the fuel cell stack outputs.

9. An apparatus for measuring voltage according to claim 1, wherein the controlling means determines that the first and the second connecting terminals are abnormally electrically connected to the at least one pair of detecting terminals if the voltage of the capacitor remains equal to the predetermined voltage.

10. A method for measuring voltage which measures output voltage between at least one pair of detecting terminals provided on a fuel cell stack comprising one or more power generating cells that are stacked together, comprising steps of:
    pre-charging a capacitor with a predetermined voltage, wherein the predetermined voltage is different than a voltage which the fuel cell stack outputs to the at least one pair of detecting terminals, the predetermined voltage is negative with respect to the output voltage from the fuel cell stack;
    connecting the capacitor to the at least one pair of detecting terminals to measure the voltage of the capacitor and obtain the output voltage between the at least one pair of detecting terminals; and
    comparing the voltage of the capacitor with the output voltage between the at least one pair of detecting terminals.

11. A method for measuring voltage according to claim 10, wherein comparing determines that the first and the second connecting terminals are normally electrically connected to the at least one pair of detecting terminals if the voltage of the capacitor changes from the predetermined voltage to the voltage which the fuel cell stack outputs.

12. A method for measuring voltage according to claim 10, wherein comparing determines that the first and the second connecting terminals are abnormally electrically connected to the at least one pair of detecting terminals if the voltage of the capacitor remains equal to the predetermined voltage.

13. An apparatus for measuring voltage which measures an output voltage between at least one pair of detecting terminals provided on a fuel cell stack comprising one or more power generating cells that are stacked together, comprising:
    a first connecting terminal connected to one of the detecting terminals in the at least one pair of detecting terminals;
    a second connecting terminal connected to the other of the detecting terminal of the at least one pair of detecting terminals;
    a capacitor connected between the first connecting terminal and the second connecting terminal;
    a voltage detector for measuring a voltage of the capacitor;
    a pre-charger for pre-charging the capacitor with a predetermined voltage, wherein the predetermined voltage is different than a voltage which the fuel cell stack outputs to the at least one pair of detecting terminals, the predetermined voltage is negative with respect to the output voltage from the fuel cell stack; and
    a controller for comparing the voltage of the capacitor with the voltage which the fuel cell stack outputs.

14. An apparatus for measuring voltage according to claim 13, wherein the pre-charger comprises:
    a power source for charging the capacitor with the predetermined voltage; and
    a first switch for connecting/disconnecting the capacitor to/from the power source.

15. An apparatus for measuring voltage according to claim 14, further comprising a second switch for connecting/disconnecting the capacitor to/from the first connecting terminal.

16. An apparatus for measuring voltage according to claim 15, wherein the controller further controls:
- the first switch such that the capacitor is connected to the power source so as to be charged before the output voltage between the at least one pair of detecting terminals is measured; and
- the second switch such that the capacitor is connected to the first connecting terminal and the second connecting terminal after the capacitor has been charged.

17. An apparatus for measuring voltage according to claim 16, wherein the controller controls:
- the second switch such that the capacitor is disconnected from the first connecting terminal before the capacitor is connected to the power source; and
- the first switch such that the capacitor is disconnected from the power source before the capacitor is connected to the first connecting terminal and the second connecting terminal.

18. An apparatus for measuring voltage according to claim 17, further comprising a third switch for connecting/disconnecting the capacitor to/from the second connecting terminal, wherein the controller controls the third switch.

19. An apparatus for measuring voltage according to claim 13, wherein the capacitor is a smoothing capacitor.

20. An apparatus for measuring voltage according to claim 13, wherein the controller determines that the first and the second connecting terminals are normally electrically connected to the at least one pair of detecting terminals if the voltage of the capacitor changes from the predetermined voltage to the voltage which the fuel cell stack outputs.

21. An apparatus for measuring voltage according to claim 13, wherein the controller determines that the first and the second connecting terminals are abnormally electrically connected to the at least one pair of detecting terminals if the voltage of the capacitor remains equal to the predetermined voltage.

22. A method for measuring voltage which measures output voltage between at least one pair of detecting terminals provided on a fuel cell stack comprising one or more power generating cells that are stacked together, comprising steps of:
- pre-charging a capacitor with a predetermined voltage, wherein the predetermined voltage is different than a voltage which the fuel cell stack outputs to the at least one pair of detecting terminals, the predetermined voltage is negative with respect to the output voltage from the object under measurement;
- connecting the capacitor to the at least one pair of detecting terminals to measure the voltage of the capacitor and obtain the output voltage between the at least one pair of detecting terminals; and
- comparing the voltage of the capacitor with the output voltage between the at least one pair of detecting terminals.

23. A method for measuring voltage according to claim 22, wherein comparing determines that the first and the second connecting terminals are normally electrically connected to the at least one pair of detecting terminals if the voltage of the capacitor changes from the predetermined voltage to the voltage which the fuel cell stack outputs.

24. A method for measuring voltage according to claim 22, wherein comparing determines that the first and the second connecting terminals are abnormally electrically connected to the at least one pair of detecting terminals if the voltage of the capacitor remains equal to the predetermined voltage.

* * * * *